US012784794B2

(12) United States Patent
Lin et al.

(10) Patent No.: US 12,784,794 B2
(45) **Date of Patent: *Nov. 3, 2026**

(54) LAYOUT PATTERN OF MAGNETORESISTIVE RANDOM ACCESS MEMORY

(71) Applicant: UNITED MICROELECTRONICS CORP., Hsin-Chu City (TW)

(72) Inventors: Hung-Chan Lin, Tainan City (TW); Jia-Rong Wu, Kaohsiung City (TW); Yi-Ting Wu, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 114 days.

This patent is subject to a terminal disclaimer.

(21) Appl. No.: 18/950,204

(22) Filed: Nov. 18, 2024

(65) Prior Publication Data

US 2025/0078891 A1 Mar. 6, 2025

Related U.S. Application Data

(63) Continuation of application No. 18/108,025, filed on Feb. 10, 2023, now Pat. No. 12,190,926.

(30) Foreign Application Priority Data

Dec. 20, 2022 (CN) ......................... 202211648842.9

(51) Int. Cl.
*G11C 11/15* (2006.01)
*G11C 11/16* (2006.01)
(Continued)

(52) U.S. Cl.
CPC ........ *G11C 11/161* (2013.01); *G11C 11/1673* (2013.01); *G11C 11/1675* (2013.01);
(Continued)

(58) Field of Classification Search
CPC ................................ G11C 11/15; H10B 61/20
See application file for complete search history.

(56) References Cited

U.S. PATENT DOCUMENTS 9,230,626 B2 1/2016 Buhrman et al.
12,190,926 B2 * 1/2025 Lin ...................... G11C 11/161
(Continued)

OTHER PUBLICATIONS

Lin, the specification, including the claims, and drawings in the U.S. Appl. No. 17/574,569, filed Jan. 13, 2022.

*Primary Examiner* — Jason Lappas
(74) *Attorney, Agent, or Firm* — Winston Hsu

(57) ABSTRACT

A layout pattern of a magnetoresistive random access memory (MRAM) includes a substrate having a first cell region, a second cell region, a third cell region, and a fourth cell region, a first gate pattern extending from the first cell region to the third cell region along a first direction, a first diffusion region extending from the first cell region to the second cell region along a second direction, a first metal pattern adjacent to one side of the first gate pattern and overlapping the first diffusion region, a source line pattern extending from the first cell region to the second cell region along the second direction, and a first spin orbit torque (SOT) pattern extending along the first direction and overlapping the first metal pattern and the source line pattern.

19 Claims, 6 Drawing Sheets

(51) Int. Cl.
*H10B 61/00* (2023.01)
*H10N 50/10* (2023.01)

(52) U.S. Cl.
CPC ............. *H10B 61/20* (2023.02); *H10N 50/10* (2023.02); *G11C 11/15* (2013.01)

(56) References Cited

U.S. PATENT DOCUMENTS

| | | | | |
|---|---|---|---|---|
| 2021/0343786 | A1 | 11/2021 | Wang | |
| 2022/0139991 | A1* | 5/2022 | Kim | H10B 61/00 257/777 |
| 2024/0203471 | A1* | 6/2024 | Lin | G11C 11/161 |

* cited by examiner

LAYOUT PATTERN OF MAGNETORESISTIVE RANDOM ACCESS MEMORY

CROSS REFERENCE TO RELATED APPLICATIONS

This application is a continuation application of U.S. application Ser. No. 18/108,025, filed on Feb. 10, 2023. The content of the application is incorporated herein by reference.

BACKGROUND OF THE INVENTION

1. Field of the Invention

The invention relates to a layout pattern for magnetoresistive random access memory (MRAM).

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a layout pattern of a magnetoresistive random access memory (MRAM) includes a substrate having a first cell region, a second cell region, a third cell region, and a fourth cell region, a first gate pattern extending from the first cell region to the third cell region along a first direction, a first diffusion region extending from the first cell region to the second cell region along a second direction, a first metal pattern adjacent to one side of the first gate pattern and overlapping the first diffusion region, a source line pattern extending from the first cell region to the second cell region along the second direction, and a first spin orbit torque (SOT) pattern extending along the first direction and overlapping the first metal pattern and the source line pattern.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." The terms "connect", "couple" and "couples" are intended to mean either an indirect or a direct electrical connection. Thus, if a first device couples to a second device, that connection may be through a direct electrical connection, or through an indirect electrical connection via other devices and connections.

Figure 1:
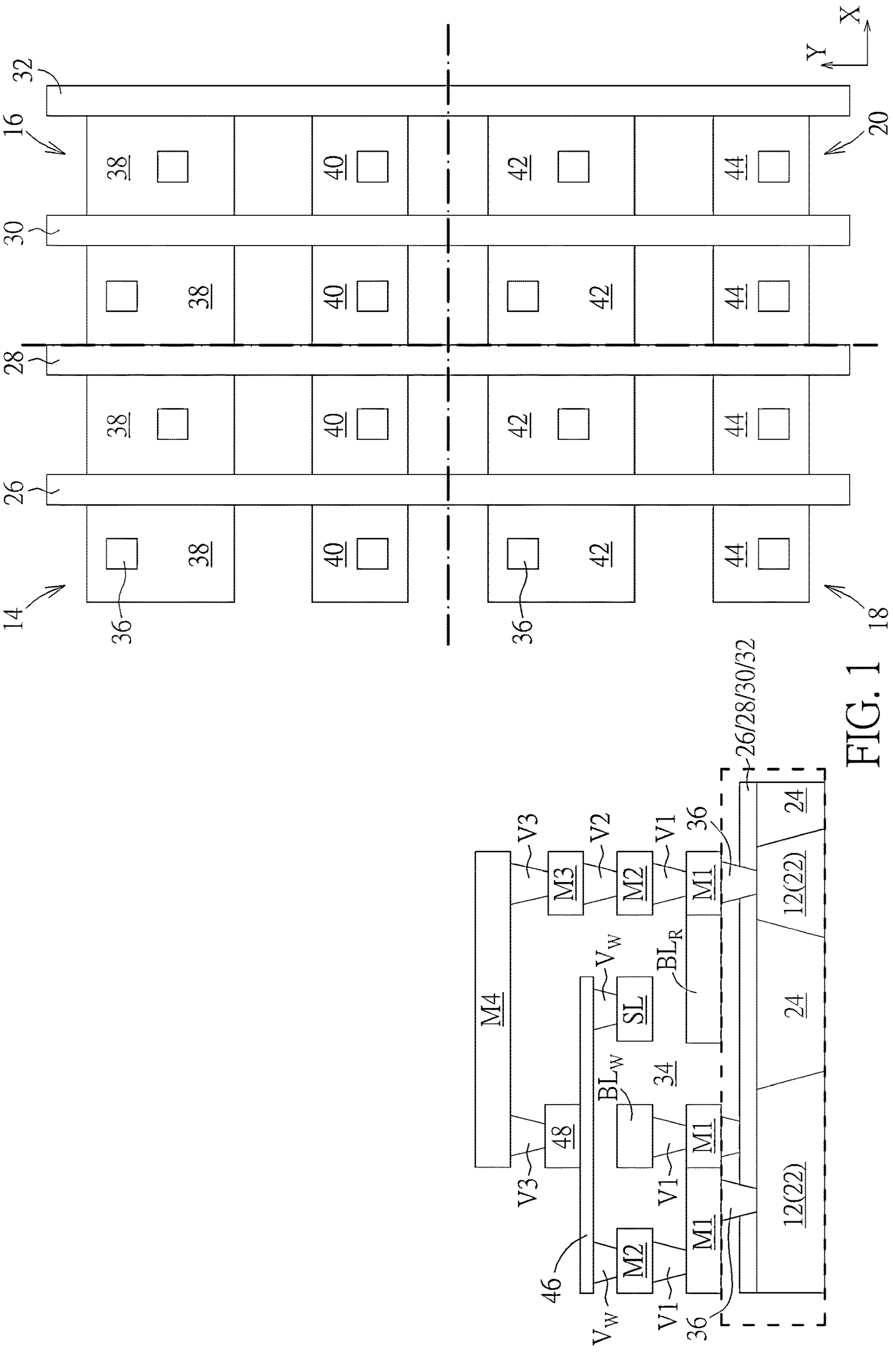
FIGS. 1-6 illustrate a layout pattern and corresponding cross-section structures of a MRAM device according to an embodiment of the present invention.

Referring to FIGS. 1-6, FIGS. 1-6 illustrate a layout pattern and corresponding cross-section structures of a MRAM device according to an embodiment of the present invention, in which the right portions of FIGS. 1-6 illustrate top views of the MRAM device, the left portions of FIGS. 1-6 illustrate cross-section views of the MRAM device, and the dotted portions shown on left portions of FIGS. 1-6 are principal elements corresponding to each figure also shown on right portions of FIGS. 1-6. As shown in FIG. 1, a substrate 12 made of semiconductor material is provided, in which the substrate 12 could be selected from the group consisting of silicon (Si), germanium (Ge), Si—Ge compounds, silicon carbide (SiC), and gallium arsenide (GaAs). Next, a first cell region 14, a second cell region 16, a third cell region 18, and a fourth cell region 20 are defined on the substrate 12, in which each of the cell regions or memory cell regions preferably include two sets of transistors and a MTJ for constituting a 2T1MTJ cell structure.

As shown on the left portion of FIG. 1, an active area 22 and a shallow trench isolation (STI) 24 made of silicon oxide separating the active area 22 are disposed on the substrate 12, and active devices such as metal-oxide semiconductor (MOS) transistors, passive devices, conductive layers, and a dielectric layer 34 such as an interlayer dielectric (ILD) layer could also be formed on top of the substrate 12. More specifically, planar MOS transistors or non-planar (such as FinFETs) MOS transistors could be formed on the substrate 12, in which the MOS transistors could include transistor elements such as gate structures or gate patterns 26, 28, 30, 32, source/drain regions or diffusion regions, spacers, epitaxial layers, and a contact etch stop layer (CESL). The dielectric layer 34 such as an ILD layer could be formed on the substrate 12 to cover the MOS transistors, and a plurality of contact plugs 36 could be formed in the dielectric layer 34 to electrically connect to the diffusion regions. Since the fabrication of planar or non-planar transistors and ILD layer is well known to those skilled in the art, the details of which are not explained herein for the sake of brevity.

As shown on the right portion of FIG. 1, a plurality of gate patterns 26, 28, 30, 32 are disposed extending along a first direction such as Y-direction to overlap each of the cell regions. For instance, the gate patterns 26, 28 are extending from the first cell region 14 to the third cell region 18 while the gate patterns 30, 32 are extending from the second cell region 16 to the fourth cell region 20. In this embodiment, each of the gate patterns 26, 28, 30, 32 could include polysilicon gate patterns or metal gate patterns, which are all within the scope of the present invention. A plurality of diffusion regions 38, 40, 42, 44 are disposed on the substrate 12 extending along a second direction such as X-direction adjacent to two sides of the gate patterns 26, 28, 30, 32. For instance, the diffusion regions 38, 40 are extending from the first cell region 14 to the second cell region 16 along the X-direction, the diffusion regions 42, 44 are extending from the third region 18 to the fourth region 20 also along the X-direction, and at least a contact plug 36 could be disposed on each of the diffusion regions 38, 40, 42, 44.

Figure 2:
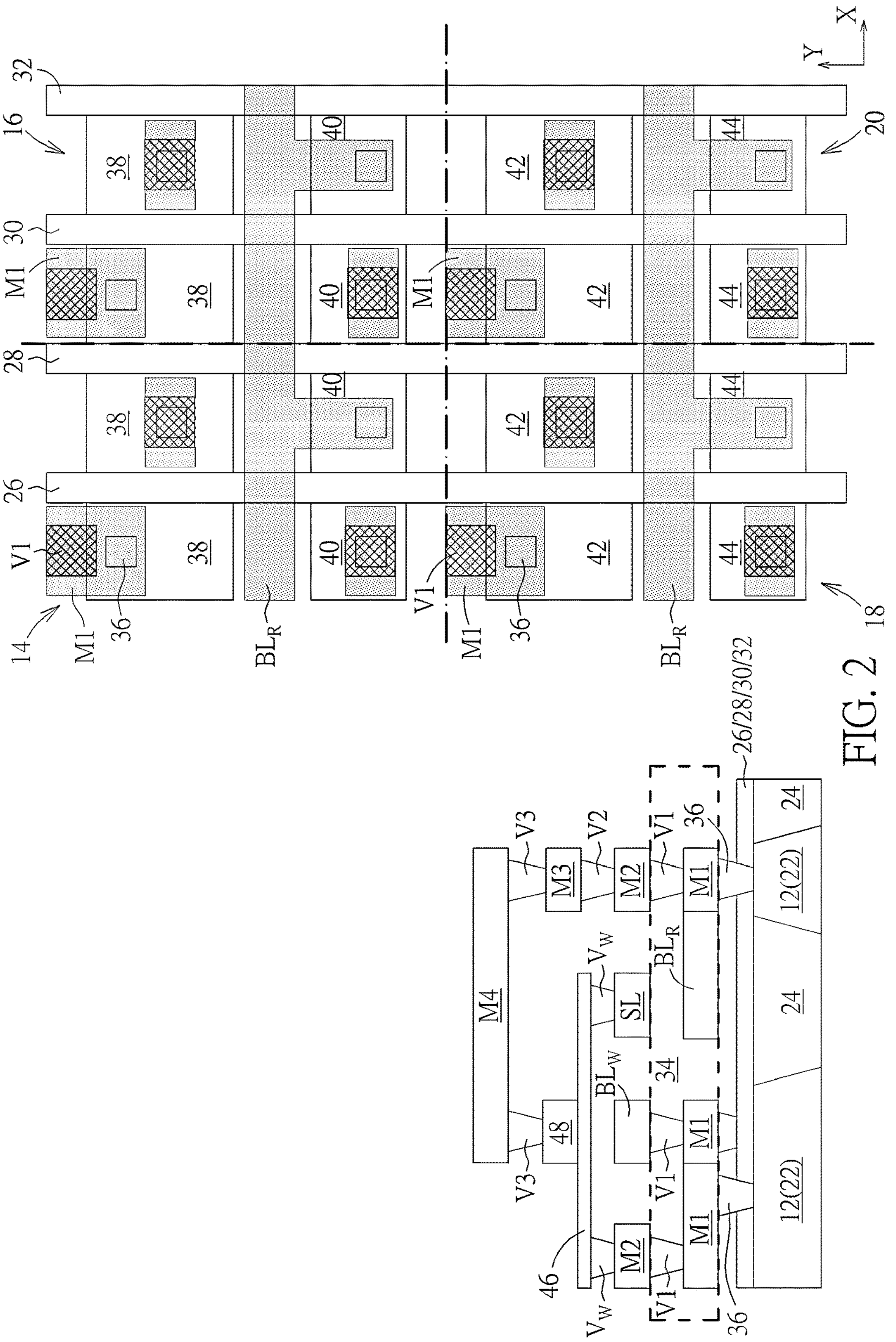

As shown on the left portion of FIG. 2, a plurality of metal patterns M1, V1 are disposed in the dielectric layer 34 through single damascene or dual damascene process and connected to the contact plugs 36, in which the metal patterns M1 are preferably first level metal interconnections while the metal patterns V1 are first level contact vias, each of the metal patterns M1 include a trench conductor, and each of the metal patterns V1 include a via conductor. It should be noted that in the first level metal interconnections or metal patterns M1, part of the metal patterns are bit line patterns $BL_R$ for read operations.

Each of the metal patterns M1, V1 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. The dielectric layer 34 could include silicon oxide such as tetraethyl orthosilicate (TEOS) or ultra-low k dielectric material, but not limited thereto.

As shown on the right portion of FIG. 2, the metal patterns M1 are disposed adjacent to two sides of the gate patterns 26, 28, 30, 32 and overlapping the diffusion regions 38, 40, 42, 44, a bit line pattern $BL_R$ is disposed between the diffusion regions 38, 40 and extending from the first cell region 14 to the second cell region 16 along the X-direction, and another bit line pattern $BL_R$ is disposed between the diffusion regions 42, 44 and extending from the third cell region 18 to the fourth cell region 20 along the X-direction. The metal patterns V1 made of via conductors are disposed adjacent to two sides of the gate patterns 26, 28, 30, 32 and overlapping the metal patterns M1 made of trench conductors.

Figure 3:
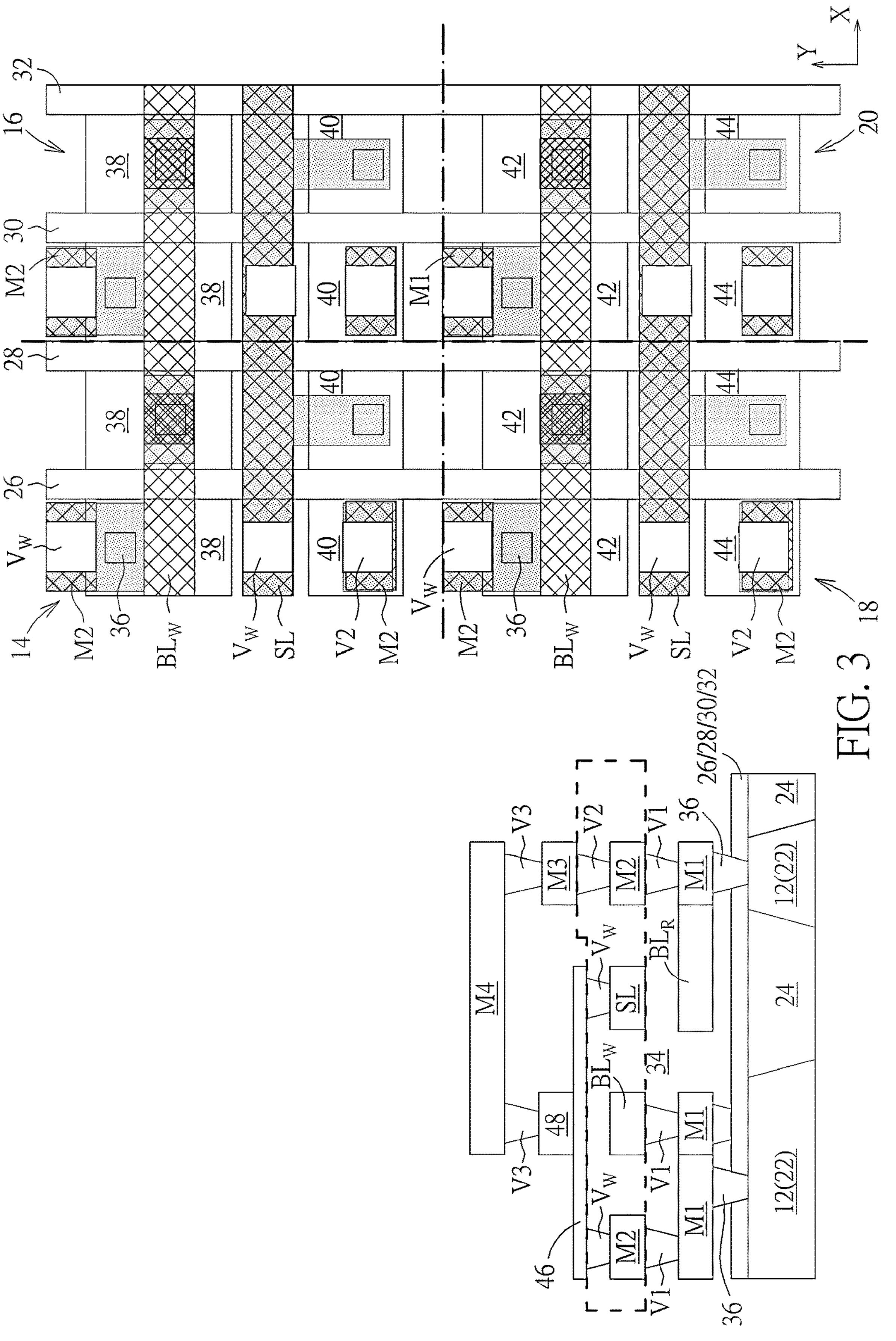

As shown on the left portion of FIG. 3, the MRAM device also includes a plurality of metal patterns M2 and metal patterns $V_W$, V2 disposed in the dielectric layer 34 and on the metal patterns V1 according to single damascene or dual damascene process, in which the metal patterns M2 are second level metal interconnections, the metal patterns V2 are second level contact vias, each of the metal patterns M2 include a trench conductor, and each of the metal patterns $V_W$, V2 include via conductors. It should be noted that part of the second level metal interconnections further include bit line patterns $BL_W$ for write operations and source line patterns SL disposed directly under spin orbit torque (SOT) patterns 46 formed afterwards.

Similar to the aforementioned metal patterns M1 and V1, each of the metal patterns M2, $V_W$, V2 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). It should be noted that the metal pattern $V_W$ made of via conductors and disposed directly under the SOT patterns 46 formed afterwards are preferably made of tungsten (W) while the other metal patterns V2 also made of via conductors and directly under the SOT patterns 46 are preferably made of copper (Cu).

As shown on right portion of FIG. 3, the bit line patterns $BL_W$ from the second level metal patterns M2 are extending from the first cell region 14 to the second cell region 16 and/or extending from the third cell region 18 to the fourth cell region 20 along the X-direction, the source line patterns SL are also extending from the first cell region 14 to the second cell region 16 and/or extending from the third cell region 18 to the fourth cell region 20 along the X-direction, the remaining second level metal patterns M2 are disposed adjacent to one side such as left side of the gate patterns 26, 30 and overlapping the diffusion regions 38, 40, 42, 44 on the first cell region 14, the second cell region 16, the third cell region 18, and the fourth cell region 20, and the second level contact vias or metal patterns V2 are disposed adjacent to one side such as left side of the gate patterns 26, 30 and overlapping the second level metal interconnections or metal patterns M2 on the first cell region 14, the second cell region 16, the third cell region 18, and the fourth cell region 20.

Figure 4:
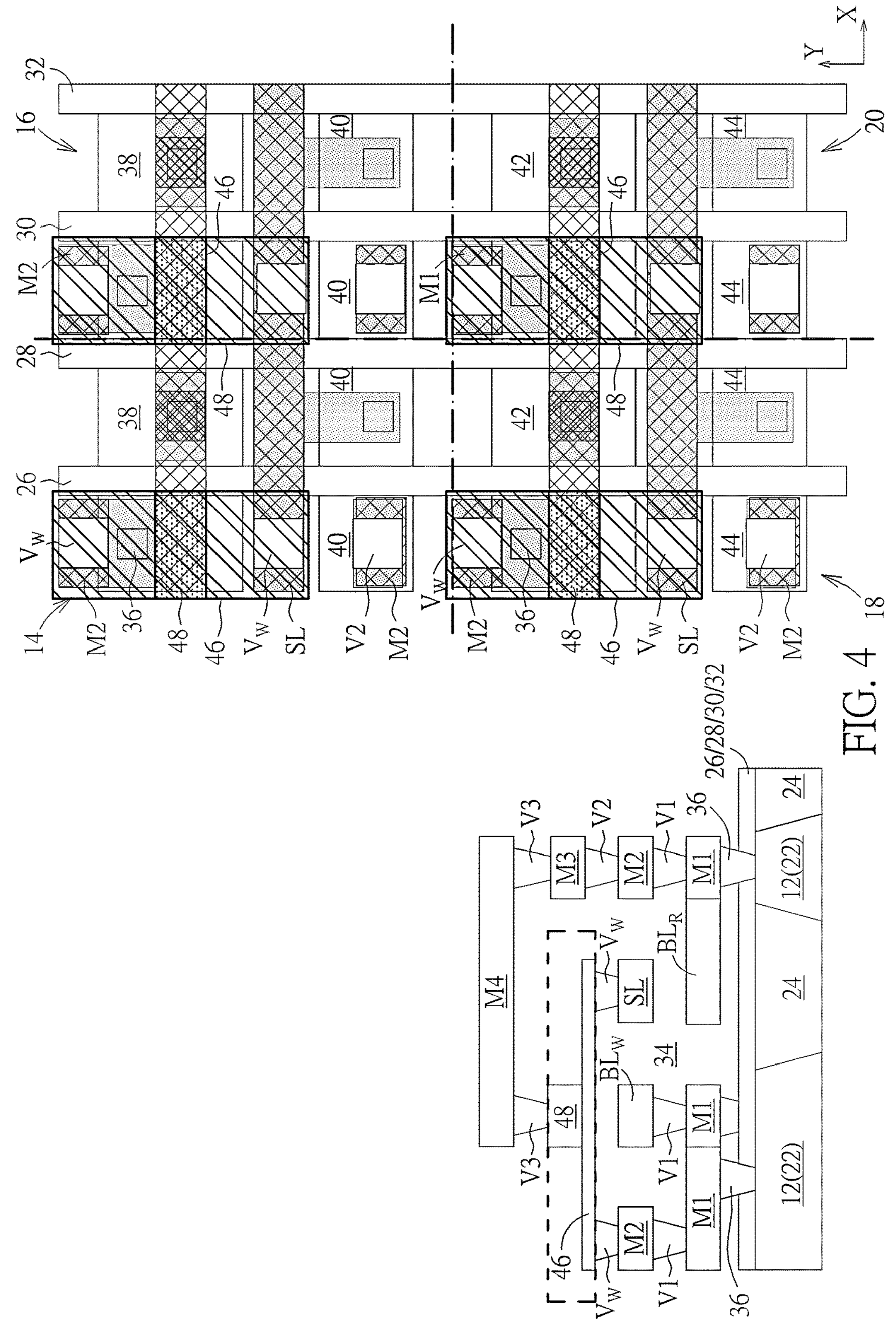

Next, as shown on the left portion of FIG. 4, the MRAM device includes a SOT layer or SOT pattern 46 and a MTJ 48 disposed on and directly contacting the metal pattern $V_W$. Preferably, the SOT pattern 46 is serving as a channel for the MRAM device as the SOT pattern 46 could include metals such as tantalum (Ta), tungsten (W), platinum (Pt), or hafnium (Hf) and/or topological insulator such as bismuth selenide ($Bi_xSe_{1-x}$). It should be noted that since the present invention pertains to a top-pin SOT MRAM device, the bottom surface of the SOT pattern 46 is preferably connected to two metal patterns $V_W$ at the same time while the top surface of the SOT pattern 46 is connected to a pinned layer of the MTJ 48.

In this embodiment, the formation of the MTJ 48 could be accomplished by sequentially depositing a pinned layer, a barrier layer, and a free layer on the SOT pattern 46. Preferably, the pinned layer could be made of ferromagnetic material including but not limited to for example iron, cobalt, nickel, or alloys thereof such as cobalt-iron-boron (CoFeB) or cobalt-iron (CoFe). Alternatively, the pinned layer could also be made of antiferromagnetic (AFM) material including but not limited to for example ferromanganese (FeMn), platinum manganese (PtMn), iridium manganese (IrMn), nickel oxide (NiO), or combination thereof, in which the pinned layer is formed to fix or limit the direction of magnetic moment of adjacent layers. The barrier layer could be made of insulating material including but not limited to for example oxides such as aluminum oxide ($AlO_x$) or magnesium oxide (MgO). The free layer could be made of ferromagnetic material including but not limited to for example iron, cobalt, nickel, or alloys thereof such as cobalt-iron-boron (CoFeB), in which the magnetized direction of the free layer could be altered freely depending on the influence of outside magnetic field.

As shown on the right portion of FIG. 4, the SOT patterns 46 are disposed adjacent to one side such as left side of the gate patterns 26, 30 on the first cell region 14, the second cell region 16, the third cell region 18, and the fourth cell region 20 and extending along the Y-direction while overlapping the lower level metal patterns M2 including the bit line patterns $BL_W$ and the source line patterns SL. The MTJs 48 are also disposed adjacent to one side such as left side of the gate patterns 26, 30 on the first cell region 14, the second cell region 16, the third cell region 18, and the fourth cell region 20. Preferably, the MTJs 48 are extending along the X-direction on the SOT patterns 46.

Figure 5:
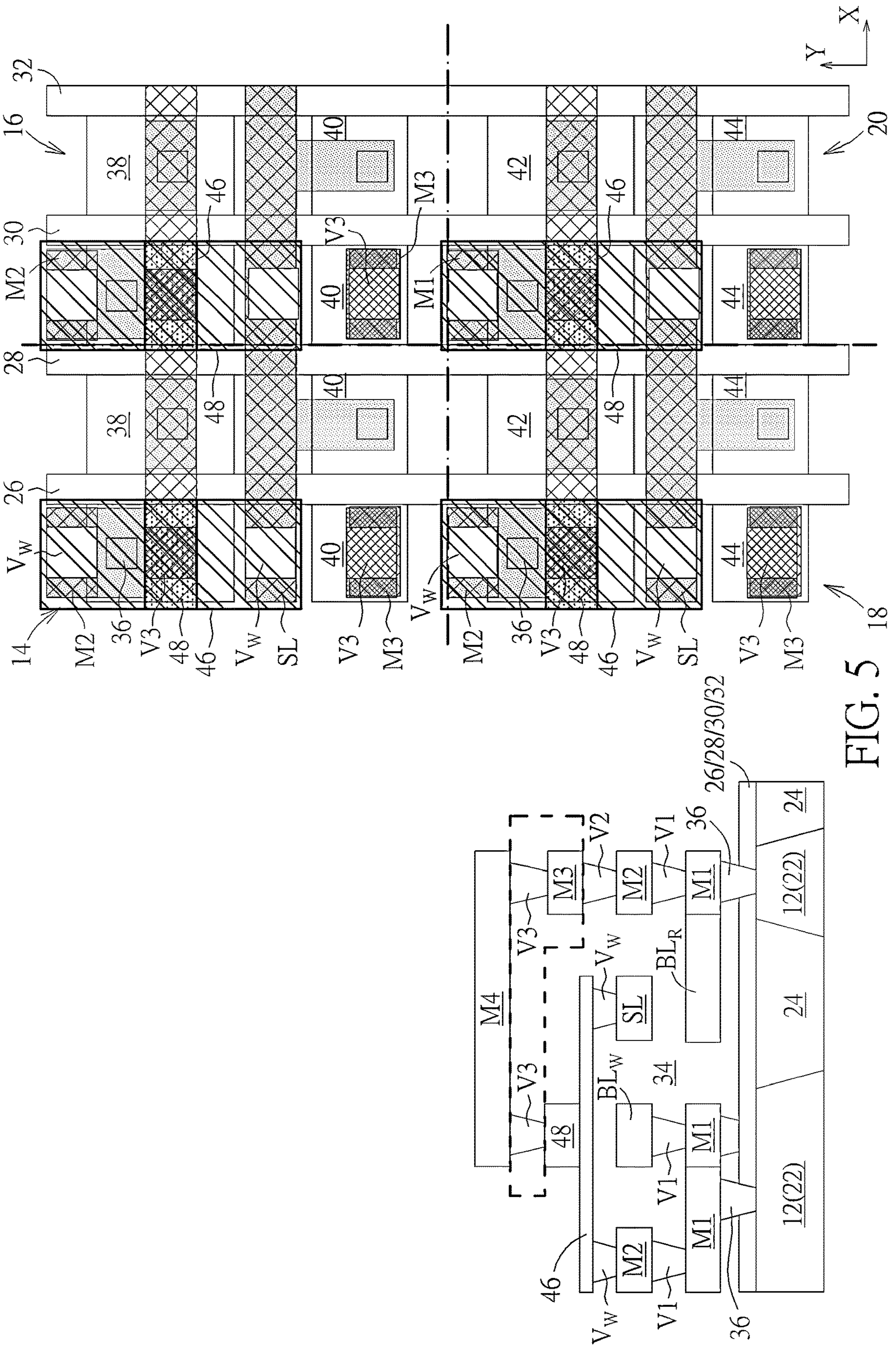

Next, as shown on the left portion of FIG. 5, the MRAM device also includes a plurality of metal patterns M3 and metal patterns V3 in the dielectric layer 34 according to single damascene or dual damascene process and on top of the MTJ 48 and the metal patterns V2, in which the metal patterns M3 are third level metal interconnections, the metal patterns V3 are third level contact vias, each of the metal patterns M3 include a trench conductor, and each of the metal patterns V3 include a via conductor. Similar to the aforementioned metal patterns M2 and V2, each of the metal patterns M3, V3 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP).

As shown on the right portion of FIG. 5, the third level metal interconnections or third level metal patterns M3 are disposed adjacent to one side such as left side of the gate patterns 26, 30 and overlapping the second level contact vias V2, the third level contact vias or metal patterns V3 are also disposed adjacent to one side such as left side of the gate patterns 26, 30 and overlapping the third level metal interconnections or metal patterns M3 and MTJs 48.

Figure 6:
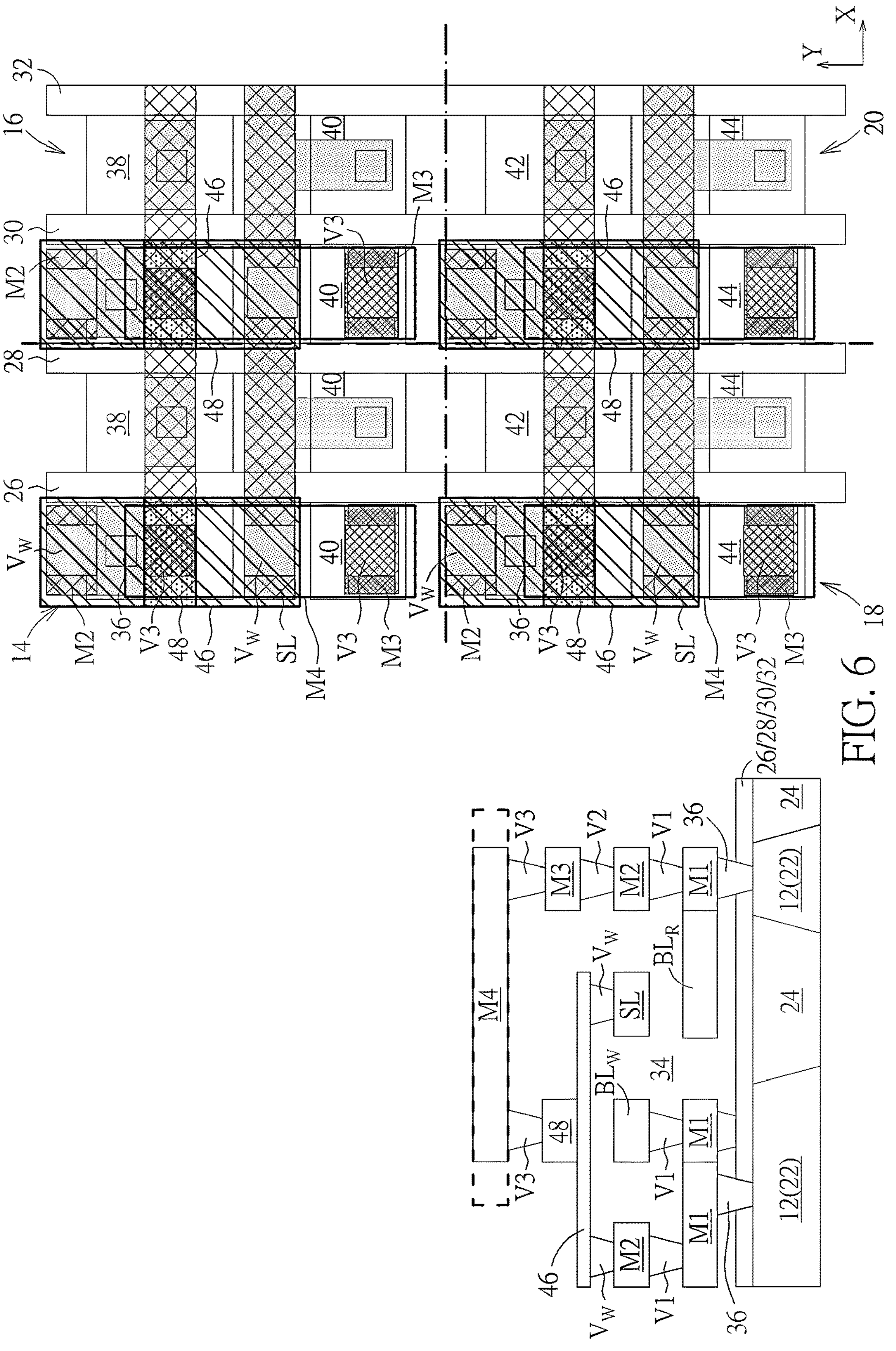

Lastly, as shown on the left portion of FIG. 6, the MRAM device further includes fourth level metal interconnections or metal pattern M4 connecting to the third level contact vias of metal patterns V3 underneath. Similar to the metal patterns M3, each of the metal patterns M4 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP).

As shown on the right portion of FIG. 6, the fourth level metal interconnections or metal patterns M4 are disposed adjacent to one side such as left side of the gate patterns 26, 30 on the first cell region 14, the second cell region 16, the third cell region 18, and the fourth cell region 20 and extending along the Y-direction while overlapping the third level contact vias or metal patterns V3, MTJs 48, SOT patterns 46, and third level metal interconnections or metal patterns M3 underneath.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout pattern of a magnetoresistive random access memory (MRAM), comprising:
- a substrate comprising a first cell region, a second cell region, a third cell region, and a fourth cell region;
- a first gate pattern extending from the first cell region to the third cell region along a first direction;
- a second gate pattern extending from the first cell region to the third cell region along the first direction, wherein the second gate pattern is immediately adjacent to the second cell region;
- a first diffusion region extending from the first cell region to the second cell region along a second direction;
- a first metal pattern adjacent to one side of the first gate pattern and overlapping the first diffusion region;
- a source line pattern extending from the first cell region to the second cell region along the second direction; and
- a first spin orbit torque (SOT) pattern extending along the first direction and overlapping the first metal pattern and the source line pattern.

2. The layout pattern of a MRAM of claim 1, further comprising:
- a second diffusion region extending from the first cell region to the second cell region along the second direction;
- a second metal pattern adjacent to one side of the first gate pattern and overlapping the second diffusion region; and
- a bit line pattern extending from the first cell region to the second cell region along the second direction.

3. The layout pattern of a MRAM of claim 1, wherein the source line pattern overlaps the first gate pattern and the second gate pattern.

4. The layout pattern of a MRAM of claim 1, wherein the bit line pattern is between the first metal pattern and the source line pattern.

5. The layout pattern of a MRAM of claim 2, wherein the source line pattern is between the first diffusion region and the second diffusion region.

6. The layout pattern of a MRAM of claim 2, wherein the first metal pattern and the bit line pattern are on the same level.

7. The layout pattern of a MRAM of claim 1, wherein the first metal pattern and the source line pattern are on the same level.

8. The layout pattern of a MRAM of claim 2, further comprising a first magnetic tunneling junction (MTJ) extending along the second direction on the first SOT pattern.

9. The layout pattern of a MRAM of claim 8, wherein the first MTJ overlaps the bit line pattern.

10. The layout pattern of a MRAM of claim 1, further comprising:
- a third gate pattern extending from the second cell region to the fourth cell region along the first direction;
- the first diffusion region extending from the first cell region to the second cell region along the second direction;
- a third metal pattern adjacent to one side of the third gate pattern and overlapping the first diffusion region;
- the source line pattern extending from the first cell region to the second cell region along the second direction; and
- a second SOT pattern extending along the first direction and overlapping the third metal pattern and the source line pattern.

11. The layout pattern of a MRAM of claim 10, further comprising:
- a fourth gate pattern extending from the second cell region to the fourth cell region along the first direction;

the second diffusion region extending from the first cell region to the second cell region along the second direction;

a fourth metal pattern adjacent to one side of the third gate pattern and overlapping the second diffusion region; and the bit line pattern extending from the first cell region to the second cell region along the second direction.

12. The layout pattern of a MRAM of claim 11, wherein the third gate pattern is between the first cell region and the fourth gate pattern.

13. The layout pattern of a MRAM of claim 11, wherein the source line pattern overlaps the third gate pattern and the fourth gate pattern.

14. The layout pattern of a MRAM of claim 10, wherein the bit line pattern is between the third metal pattern and the source line pattern.

15. The layout pattern of a MRAM of claim 11, wherein the source line pattern is between the first diffusion region and the fourth metal pattern.

16. The layout pattern of a MRAM of claim 11, wherein the third metal pattern and the bit line pattern are on the same level.

17. The layout pattern of a MRAM of claim 10, wherein the third metal pattern and the source line pattern are on the same level.

18. The layout pattern of a MRAM of claim 11, further comprising a second MTJ extending along the second direction on the second SOT pattern.

19. The layout pattern of a MRAM of claim 18, wherein the second MTJ overlaps the bit line pattern.

* * * * *